United States Patent
Liu et al.

(10) Patent No.: US 9,502,570 B2
(45) Date of Patent: Nov. 22, 2016

(54) THIN FILM TRANSISTOR AND MANUFACTURING METHOD THEREOF, AN ARRAY SUBSTRATE AND A DISPLAY DEVICE

(71) Applicant: BOE Technology Group Co., Ltd., Beijing (CN)

(72) Inventors: Xiang Liu, Beijing (CN); Gang Wang, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 14/057,728

(22) Filed: Oct. 18, 2013

(65) Prior Publication Data

US 2014/0110716 A1   Apr. 24, 2014

(30) Foreign Application Priority Data

Oct. 19, 2012   (CN) .......................... 2012 1 0401275

(51) Int. Cl.
*H01L 21/28*   (2006.01)
*H01L 29/786*   (2006.01)
(Continued)

(52) U.S. Cl.
CPC ....... *H01L 29/786* (2013.01); *H01L 21/28008* (2013.01); *H01L 27/124* (2013.01);
(Continued)

(58) Field of Classification Search
CPC .......................... H01L 27/1214; H01L 29/785
USPC .......................................... 257/59; 438/157
See application file for complete search history.

(56) References Cited

U.S. PATENT DOCUMENTS

2005/0285197 A1   12/2005 Park

2007/0013077 A1   1/2007 Lee et al.
(Continued)

FOREIGN PATENT DOCUMENTS

| CN | 1716635 A | 1/2006 |
|---|---|---|
| CN | 1897269 A | 1/2007 |

(Continued)

OTHER PUBLICATIONS

Notification of the First Office Action from the Chinese Patent Office for priority application 201210401275.7 dated Sep. 2, 2014 with English translation.
(Continued)

*Primary Examiner* — Fernando L Toledo
*Assistant Examiner* — Neil Prasad
(74) *Attorney, Agent, or Firm* — Frommer Lawrence & Haug LLP

(57) ABSTRACT

Embodiments of the present invention provide a thin film transistor and its manufacturing method, an array substrate and a display device, to improve the electrical performance of the thin film transistor and improve the picture quality of images displayed by the display device. The thin film transistor includes: a substrate; a gate, a source, a drain and a semiconductor layer formed on the substrate; a first gate protection layer; a gate isolation layer; and a second gate protection layer. The first gate protection layer is at least partly located between the gate and the semiconductor layer, and is an insulating layer. The gate isolation layer is at least partly located between the first gate protection layer and the second gate protection layer, and is a conductive layer. The second gate protection layer is at least partly located between the gate isolation layer and the semiconductor layer, and is an insulating layer.

19 Claims, 4 Drawing Sheets

(51) Int. Cl.
  *H01L 29/423* (2006.01)
  *H01L 29/49* (2006.01)
  *H01L 27/12* (2006.01)
  *H01L 29/66* (2006.01)

(52) U.S. Cl.
  CPC ..... *H01L29/42384* (2013.01); *H01L 29/4908* (2013.01); *H01L 29/66742* (2013.01); *H01L 29/7869* (2013.01)

(56) References Cited

U.S. PATENT DOCUMENTS

| | | |
|---|---|---|
| 2008/0131663 A1 | 6/2008 | Tanaka et al. |
| 2009/0230390 A1 | 9/2009 | Gosain et al. |
| 2010/0117074 A1* | 5/2010 | Yamazaki et al. ............. 257/43 |
| 2011/0073867 A1 | 3/2011 | Xie et al. |
| 2011/0114941 A1* | 5/2011 | Kato et al. .................... 257/43 |
| 2012/0112184 A1* | 5/2012 | Yamazaki et al. ............. 257/43 |
| 2012/0248451 A1 | 10/2012 | Sone et al. |
| 2013/0181222 A1 | 7/2013 | Liu et al. |
| 2014/0061633 A1 | 3/2014 | Wang et al. |

FOREIGN PATENT DOCUMENTS

| | | |
|---|---|---|
| CN | 101533857 A | 9/2009 |
| CN | 102033343 A | 4/2011 |
| CN | 202009000 U | 10/2011 |
| CN | 102646676 A | 8/2012 |
| CN | 102646699 A | 8/2012 |
| CN | 102654698 A | 9/2012 |
| CN | 202905721 U | 4/2013 |

OTHER PUBLICATIONS

Extended European search report and examination report from the European Patent Office for corresponding application 13189461.0 dated Jan. 17, 2014.

Notification of Second Office Action issued by Chinese Patent Office for priority application 201210401275.7 dated Dec. 31, 2014 with English translation.

Notification of Third Office Action issued by Chinese Patent Office for priority application 201210401275.7 dated Mar. 23, 2015 with English translation.

Notification of Fourth Office Action issued by Chinese Patent Office for priority application 201210401275.7 dated Jun. 30, 2015 with English translation.

* cited by examiner

THIN FILM TRANSISTOR AND MANUFACTURING METHOD THEREOF, AN ARRAY SUBSTRATE AND A DISPLAY DEVICE

FIELD OF THE INVENTION

Embodiments of the present invention relate to the field of display technology, especially to a thin film transistor and its manufacturing method, an array substrate and a display device.

BACKGROUND OF THE INVENTION

In the field of display technology, a flat panel display device, such as a Liquid Crystal Display (LCD) and Organic Light Emitting Display (OLED) have an important place in the area of display due to their advantages of light weight, thinness, low power consumption, high brightness, and high picture quality.

In particular, a flat panel display device with high resolution and high picture quality is favored by people. Currently, delay of image signals is one of the key factors that restrict the flat panel display device with high resolution and high picture quality. Specifically, the delay of image signal is mainly determined by the resistance of gates and gate lines on an array substrate and the related capacitance. When opening the gate lines, the corresponding pixels are charged, and some of the pixels are charged insufficiently due to the delay of image signals, which causes the brightness of image display pictures to be nonuniform and badly affects display quality of images. Decreasing resistance of the gates and the gate lines can decrease the delay of image signals, and thus improving picture quality of images.

Currently, a method for decreasing the resistance of the gates and gate lines is: using copper (Cu) which has low resistance to produce the gates and scan lines (those are the gate lines). However, the above-mentioned method has the following disadvantages:

Cu is easy to diffuse and easily diffuses into a gate protection layer, a semiconductor layer, a passivation layer, etc., which seriously affects the performance of a thin film transistor (TFT). In the prior art, when manufacturing a top-gate type TFT, a semiconductor layer is formed firstly, and a insulating barrier layer is deposited before depositing a Cu metal gate and a gate line thin film, so as to prevent the Cu ions from diffusing toward a gate insulating layer and the semiconductor layer, but in a subsequent heating process, the activity of the Cu ions increases, therefore they can still traverse the insulating barrier layer and permeate into the semiconductor layer, and thus seriously impacting the performance of the TFT, making the picture quality of images worse, and even destroying normal operation of the TFT.

A TFT on an existing array substrate and its manufacturing method may cause problems of performance degradation of the TFT and poor picture quality of images.

SUMMARY OF THE INVENTION

Embodiments of the present invention provide a thin film transistor and manufacturing method thereof, an array substrate and a display device, to improve the performance of TFT and improve the picture quality of images.

To achieve the above objective, embodiments of the present invention provide a thin film transistor, including:

a substrate;
a gate, a source, a drain and a semiconductor layer formed on the substrate;
a first gate protection layer;
a gate isolation layer; and
a second gate protection layer,
wherein the first gate protection layer is at least partly located between the gate and the gate isolation layer and is an insulating layer,
the gate isolation layer is at least partly located between the first gate protection layer and the second gate protection layer, and is a conductive layer, and
the second gate protection layer is at least partly located between the gate isolation layer and the semiconductor layer, and is a insulating layer.

Preferably, the gate isolation layer is made of a transparent metallic oxide material.

Preferably, the gate isolation layer is made of any one or any alloy of molybdenum, aluminum and niobium.

Preferably, the vertical projection of the gate isolation layer on the substrate overlaps with the vertical projection of the gate on the substrate.

Preferably, thickness of the second gate protection layer is less than that of the first gate protection layer.

Preferably, the gate is located on the substrate; the first gate protection layer at least covers the gate; the gate isolation layer is located on the first gate protection layer; the second gate protection layer at least covers the gate isolation layer; the semiconductor layer is located on the second gate protection layer; the source and the drain are at least partly located on the semiconductor layer.

Preferably, the thin film transistor further includes: a passivation layer, the passivation layer at least covers the source and the drain.

Preferably, the source and the drain are located on the substrate; the semiconductor layer at least partly covers the source and the drain; the second gate protection layer at least covers the semiconductor layer; the gate isolation layer is located on the second gate protection layer; the first gate protection layer at least covers the gate isolation layer; the gate is located on the first gate protection layer.

Preferably, the thin film transistor further includes: a passivation layer, the passivation layer at least covers the gate.

Preferably, the vertical projection of the gate isolation layer on the substrate exceeds the vertical projection of the semiconductor layer on the substrate; the vertical projections of the source and the drain on the substrate exceed the vertical projection of the semiconductor layer on the substrate; the thin film transistor further includes: a semiconductor layer protection layer, the semiconductor layer protection layer is an insulating layer, and at least partly located between a part of the gate isolation layer exceeding the semiconductor layer and a part of the source and the drain exceeding the semiconductor layer.

Preferably, the semiconductor layer protection layer at least partly contacts with the semiconductor layer, and the source and the drain are connected to the semiconductor layer through vias in the semiconductor layer protection layer Preferably, the thin film transistor further includes: a buffer layer, the buffer layer is located on a side, on which respective film layers of the thin film transistor are to be formed, of the substrate.

Preferably, the gate is made of copper.

Embodiment of the present invention provides an array substrate, including the above-mentioned thin film transistor.

The array substrate further includes: a pixel electrode, the pixel electrode and the gate isolation layer are disposed on the same layer.

The array further includes: a gate line connected to the gate, and the vertical projection of the gate and the gate line on the substrate does not exceed the vertical projection of gate isolation layer on the substrate.

Embodiments of the present invention provides a display device, including the above mentioned array substrate.

Embodiment of the present invention provides a manufacturing method of a thin film transistor, including:

A process of forming a gate, a source, a drain and a semiconductor layer, and a process of forming a first gate protection layer, a gate isolation layer, and a second gate protection layer;

wherein, the first gate protection layer is at least partly located between the gate and the gate isolation layer, and is an insulating layer, the gate isolation layer is at least partly located between the first gate protection layer and the second gate protection layer, and is a conductive layer, and the second gate protection layer is at least partly located between the gate isolation layer and the insulating layer, and is an insulating layer.

Preferably, the process of forming the gate, the source, the drain and the semiconductor layer and the step of forming the first gate protection layer, the gate isolation layer, and the second gate protection layer specifically include:

forming the gate on a substrate using a patterning process;

forming the first gate protection layer on the substrate with the gate formed thereon using the patterning process;

forming the gate isolation layer on the substrate with the first gate protection layer formed thereon using the patterning process;

forming the second gate protection layer on the substrate with the gate isolation layer formed thereon using the patterning process;

forming the semiconductor layer on the substrate with the second gate protection layer formed thereon using the patterning process; and forming the source and the drain on the substrate with the semiconductor layer formed thereon using the patterning process.

Preferably, after forming the semiconductor layer and before forming the source and the drain, it further includes: forming a semiconductor layer protection layer on the substrate with the semiconductor layer formed thereon using the patterning process, the source and the drain are formed on the semiconductor layer protection layer and are connected to the semiconductor layer through vias in the semiconductor layer protection layer.

Preferably, it further includes: forming a passivation layer on the substrate with the source and the drain formed thereon.

Preferably, the process of forming the gate, the source, the drain and the semiconductor layer and the process of forming the first gate protection layer, a gate isolation layer, and the second gate protection layer specifically include:

forming the source and the drain on a substrate using a patterning process;

forming the semiconductor layer on the substrate with the source and the drain formed thereon using the patterning process;

forming the second gate protection layer on the substrate with the semiconductor layer formed thereon using the patterning process;

forming the gate isolation layer on the substrate with the second gate protection layer formed thereon using the patterning process;

forming the first gate protection layer on the substrate with the gate isolation layer formed thereon using the patterning process; and forming the gate on the substrate with the first gate protection layer formed thereon using the patterning process.

Preferably, after forming the source and the drain and before forming the semiconductor layer, it further includes: forming a semiconductor layer protection layer on the substrate with the source and the drain formed thereon, the semiconductor layer is formed on the semiconductor layer protection layer, and the source and the drain are connected to the semiconductor layer through vias in the semiconductor layer protection layer.

Preferably, it further includes: forming a passivation layer on the substrate with the gate formed thereon.

Preferably, before the process of forming the gate, the source, the drain and the semiconductor layer and the step of forming the first gate protection layer, the gate isolation layer and the semiconductor layer protection layer, it further includes:

forming a buffer layer on the substrate.

Preferably, the thin film transistor is located in an array substrate, the array substrate further includes a pixel electrode; forming the pixel electrode located in a same layer as the gate isolation layer at the same time when forming the gate isolation layer using the patterning process, also, the gate isolation layer and the pixel electrode are formed by one-time patterning process.

The TFT provided by the present invention with the first gate protection layer, the gate isolation layer and the second gate protection layer provided between the gate and the semiconductor layer, wherein the gate isolation layer is a conductive layer (a transparent metallic oxide layer such as an indium tin oxide (ITO) layer) whose barrier capacity against metallic ions such as copper is much higher than the insulating layer (such as a silicon oxide, and a silicon nitride layer). Therefore the gate isolation layer can prevent the metallic ions in the gate from passing through. To prevent the gate isolation layer from electrically connecting the semiconductor layer and the gate, the insulating first gate protection layer is provided between the gate and the gate isolation layer, and the insulting second gate protection layer is provided between the semiconductor layer and the gate isolation layer. Thus, the gate of the thin film transistor according to the embodiments of the present invention can be formed of a metal with low resistance such as copper, and the TFT will have less delay of image signals and higher picture quality as the resistance is smaller. At the same time, its gate metal will not enter into the semiconductor layer, and the performance of the semiconductor layer will not be affected.

DETAILED DESCRIPTION OF THE PREFERRED EMBODIMENTS

Embodiments of the present invention provide a thin film transistor and its manufacturing method, an array substrate and a display device, to improve the performance of a TFT and improve the picture quality of images.

The thin film transistor provided by an embodiment of the present invention includes:

A substrate; a gate, a source, a drain and a semiconductor layer formed on the substrate; a first gate protection layer; a gate isolation layer and a second gate protection layer. The first gate protection layer is at least partly located between the gate and the gate isolation layer, and is an insulating layer. The gate isolation layer, is at least partly located between the first gate protection layer and second gate protection layer, and is a conductive layer. The second gate protection layer is at least partly located between the gate isolation layer and the semiconductor layer, and is an insulating layer.

The TFT provided by the present invention with the first gate protection layer, the gate isolation layer and the second gate protection layer provided between the gate and the semiconductor layer, wherein the gate isolation layer is a conductive layer (a transparent metallic oxide layer such as an indium tin oxide (ITO) layer) whose barrier capacity against metallic ions such as copper is much higher than the insulating layer (such as a silicon oxide, and a silicon nitride layer). Therefore, the gate isolation layer can prevent the metallic ions in the gate from passing through. To prevent the gate isolation layer from turning on the semiconductor layer and the gate, the insulating first gate protection layer is provided between the gate and the gate isolation layer, and the insulting second gate protection layer is provided between the semiconductor layer and the gate isolation layer. Thus, the gate of the thin film transistor according to the embodiments of the present invention can be formed of a metal with low resistance such as copper, and the TFT will have less delay of image signals and higher picture quality as the resistance is smaller. At the same time, its gate metal will not enter into the semiconductor layer, and the performance of the semiconductor layer will not be affected.

A TFT provided by an embodiment of the present invention may be a bottom-gate type or a top-gate type, and the bottom-gate type or the top-gate type TFT provided by the embodiment of the present invention will be described in connection with the accompanying drawings below.

Figure 1:
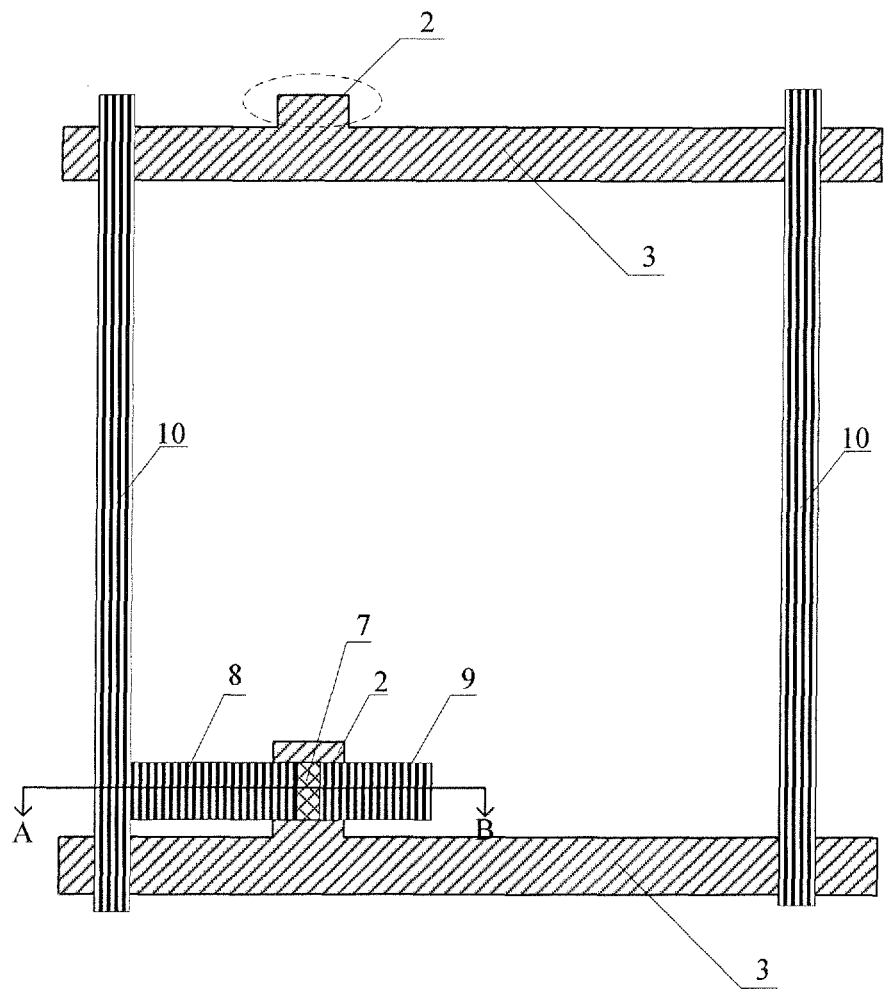
FIG. 1 is a top view of a structure of a bottom-gate type array substrate provided by an embodiment of the present invention.
Figure 2:
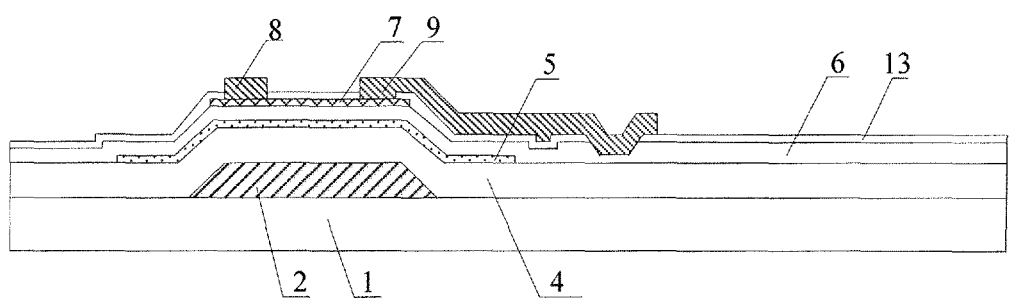
FIG. 2 is the schematic sectional view in the direction of A-B of the TFT structure shown in FIG. 1.

FIG. 1 is a top view of a TFT, FIG. 2 is a section view in the direction of A-B of the TFT shown in FIG. 1.

Referring to FIG. 2, the TFT provided by an embodiment of the present invention includes:

a substrate 1;

a gate 2 formed on the substrate 1;

a first gate protection layer 4 at least covering the gate 2;

a gate isolation layer 5 located on the first gate protection layer 4;

a second gate protection layer 6 located on the gate isolation layer 5;

a semiconductor layer 7 located on the second gate protection layer 6;

a source 8 and a drain 9 located on the semiconductor layer 7.

Wherein, preferably, the substrate is made of glass or quartz or plastic.

Figure 8:
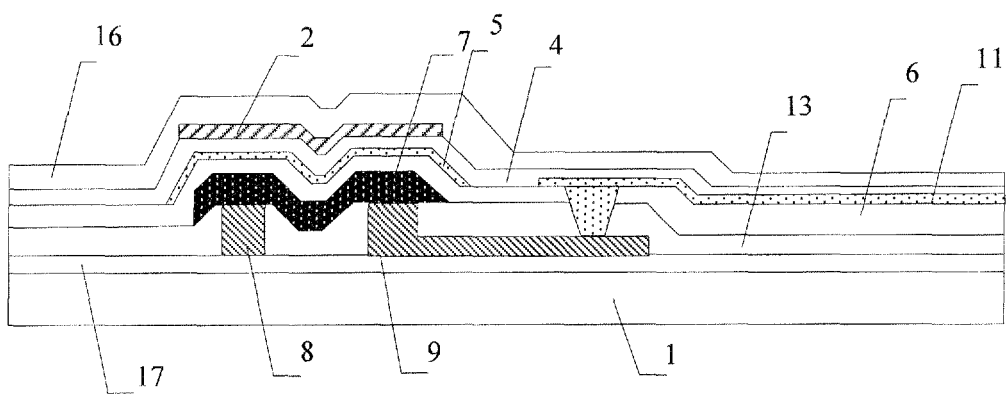
FIG. 8 is a structural schematic view of a top-gate type TFT provided by another embodiment of the present invention.

Preferably, in order to enhance the adhesion of the substrate 1 to respective film layers, referring to FIG. 8, TFT further includes a buffer layer 17, which located between the substrate 1 and the gate 2; preferably, the buffer layer 17 covers the whole substrate. That is to say, if the TFT is located in an array substrate, other structures such as pixel electrode 11 in the array substrate are also located on the buffer layer 17.

Preferably, the gate 2 is preferably made of copper, which has a low resistivity and can decrease the delay of image signals and improve the image quality.

Wherein, the first gate protection layer 4 and the second gate protection layer 6 are insulating layers, for insulating the gate 2 from the gate isolation layer 5 and insulating the gate isolation layer 5 from the semiconductor layer 7, respectively; specifically, the first gate protection layer 4 and the second gate protection layer 6 can be made of a material such as silicon oxide and silicon nitride.

Wherein, the gate isolation layer 5 is a conductive layer, for blocking metallic ions in the gate 2 from diffusing into the semiconductor layer 7; since a conductive layer has a much higher ability to block metallic ions than an insulating layer, the gate isolation layer 5 can better prevent the metallic ions from entering into the semiconductor layer 7 than an existing insulating barrier layer, thereby improving the performance of the TFT.

Preferably, the gate isolation layer 5 is made of a transparent metallic oxide material such as indium tin oxide (ITO).

ITO is a transparent conductive material commonly used by a pixel electrode 11 of an array substrate of a LCD, and when ITO is used as the material of the gate isolation layer 5, the gate isolation layer 5 and the pixel electrode 11 can be formed in a same patterning process, and therefore no process step will be added.

Preferably, the gate isolation layer 5 can also be made of any metal or any alloy of molybdenum, aluminium and niobium.

Preferably, the vertical projection of the gate isolation layer 5 on the substrate overlaps with the vertical projection of the gate 2 on the substrate.

That is to say, preferably, the gate isolation layer 5 and the gate 2 have the same patterns, and their positions corresponds to each other; since the gate isolation layer 5 is mainly used to block the metallic ions in the barrier gate 2 from diffusing, just provide the gate isolation layer 5 at a position corresponding to the gate 2.

The second gate protection layer 6 is located between the gate isolation layer 5 and the semiconductor layer 7. The second gate protection layer 6 is an insulating layer, for insulating the gate isolation layer 5 from the semiconductor layer 7.

The first gate protection layer 4 can insulate the insulating gate 2 from the gate isolation layer 5, and if the gate 2 and the gate isolation layer 5 are connected, the TFT will fail wholly. To ensure the insulating effect, the thickness of the first gate protection layer 4 should be larger. The second gate protection layer 6 can insulate the insulating gate isolation layer 5 from the semiconductor layer 7, To enhance the contact interface between the semiconductor layer 7 and the second gate protection layer 6, the thickness of the second gate protection layer 6 can be made thinner.

Therefore, further preferably, the thickness of the second gate protection layer 6 is less than the thickness of the first gate protection layer 4.

The semiconductor layer 7 forms the main part of the active region of the TFT, and is located on the gate isolation layer 5, such that the metallic ions of the gate 2 cannot diffuse into it.

Wherein, the semiconductor layer 7 can be an amorphous silicon semiconductor layer, and can also be a metal-oxide semiconductor layer, that is, the TFT provided by the embodiment of the present invention can be an amorphous silicon TFT and can also be a metal-oxide semiconductor TFT.

Preferably, referring to FIG. 2, the vertical projection of the gate isolation layer 5 on the substrate 1 exceeds the vertical projection of the semiconductor layer 7 on the substrate 1; the vertical projections of the source 8 and the drain 9 on the substrate 1 exceed the vertical projection of the semiconductor layer 7 on the substrate; and the TFT further includes a semiconductor layer protection layer 13 which is an insulating layer, and at least partly located between the part of the gate isolation layer 5 exceeding the semiconductor layer 7 and the part of the source 8 and the drain 9 exceeding the semiconductor layer 7.

That is to say, if the gate isolation layer 5 exceeds the region where the semiconductor layer 7 is located, and the source 8 and the drain 9 also exceeds the region where the semiconductor layer 7 is located, as shown in FIG. 2, the gate isolation layer 5 might have a partial region overlapping with the drain 9 (as shown in the Figures, of course may also be the source 8) in the direction perpendicular to the substrate 1, at this point, the gate isolation layer 5 and the drain 9 might be turned on in the overlapping region, thereby destroying the performance of the TFT. For this reason, a semiconductor layer protection layer 13 can be disposed at the position where the gate isolation layer 5 and the drain 9 (or the source 8) overlaps to separate the gate isolation layer 5 from the drain 9 (or the source 8).

Preferably, the semiconductor layer protection layer 13 provided by the embodiments of the present invention can be a single-layer structure such as metal oxide film layer or metal nitride film layer, or it can also be a double-layer structure, such as the superposition of a metal oxide film layer and a metal nitride film layer.

Figure 3:
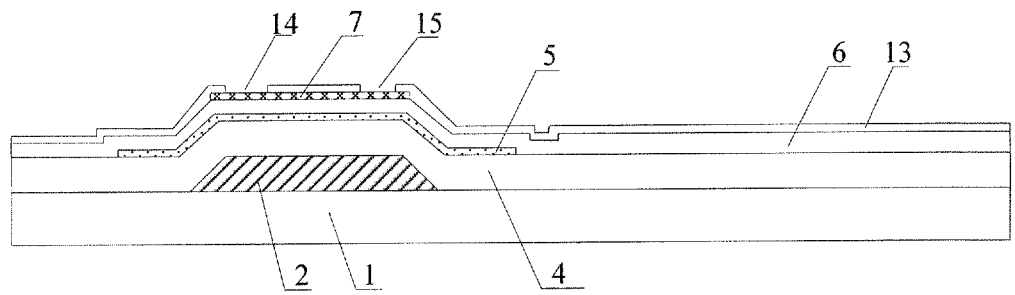
FIG. 3 is a structural schematic view of the TFT shown in FIG. 2 with a first via and a second via.
Figure 4:
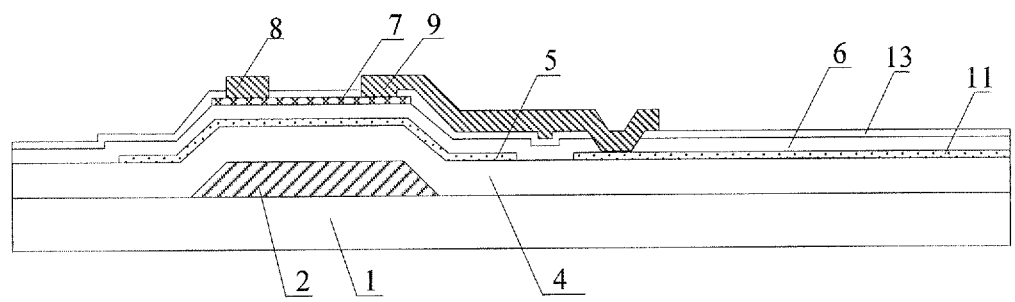
FIG. 4 is a structural schematic view of the array substrate shown in FIG. 2 with a pixel electrode.

Further preferably, referring to FIGS. 3 and 4, the semiconductor layer protection layer 13 at least partly contacts with the semiconductor layer 7, and the source 8 and the drain 9 are connected to the semiconductor layer 7 through a first via 14 and a second via 15 in the semiconductor layer protection layer 13, respectively.

That is to say, the semiconductor layer protection layer 13 also covers the semiconductor layer 7, such that it can prevent the semiconductor layer 7 from being damaged in the patterning process of forming the source 8 and the drain 9. Therefore, the source 8 and the drain 9 need to be connected to the semiconductor layer 7 through the vias (if there is no semiconductor layer protection layer 13, the source 8 and the drain 9 are located directly on the semiconductor layer 7).

Figure 6:
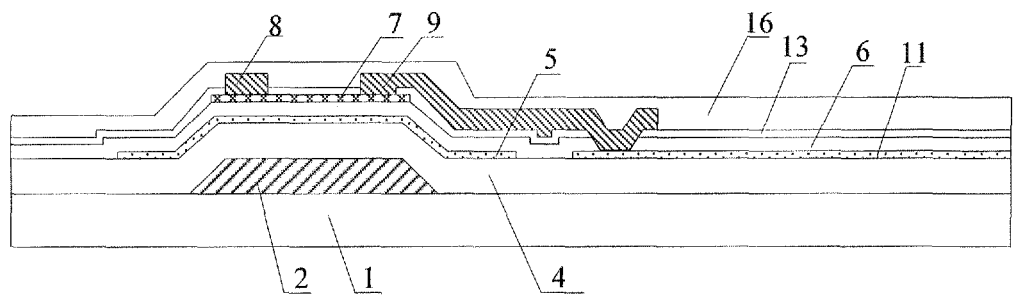
FIG. 6 is a structural schematic view of the TFT shown in FIG. 5 with a passivation layer.

Preferably, in order to protect the TFT from being affected by external factors or being damaged, referring to FIG. 6, the TFT further includes: a passivation layer 16; the passivation layer 16 is formed on the source 8 and the drain 9 which are outmost layers.

Wherein, the passivation layer 16 may be an insulating layer formed of inorganic material or organic material. Preferably, the passivation layer 16 is made of organic resin material. The organic resin may be benzocyclobutene (BOB), and may also be other organic photosensitive materials. Compared with the inorganic material, the organic resin has a smaller hardness, which facilitates smooth of the outermost layer of the array substrate, and facilitates ideal arrangement of liquid crystal molecules between the color film substrate and the array substrate.

Wherein, the thin film transistor provided by the embodiment of the present invention can be applied to but not limited to an array substrate.

Taking the array substrate as an example, the array substrate provided by an embodiment of the present invention includes: a plurality of the above-mentioned TFTs and the gate line 3 and data lines 10 connected to each TFT.

Preferably, the data line 10 is directly connected to the source 8, and the source 8, the drain 9 and the data lines 10 are formed in a one-time patterning process simultaneou sly.

Preferably, the gate line 3 and the gate 2 are made of the same material (such as copper), and are formed in a one-time patterning processing simultaneously.

Preferably, overlap of the vertical projections of the gate 2 and the gate line 3 on the substrate 1 does not exceed the vertical projection of the gate isolation layer 5 on the substrate 1.

That is to say, when gate line 3 exists, preferably, the gate isolation layer 5 is also distributed at a position corresponding to the gate line 3, thereby preventing the metallic ions in the gate line 3 from entering into other structures.

Figure 5:
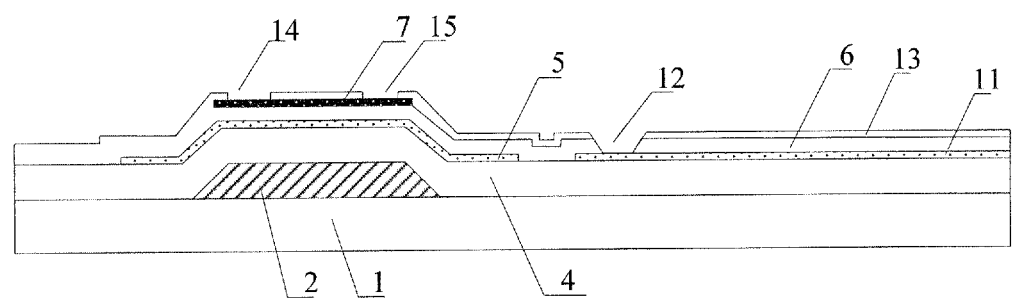
FIG. 5 is a structural schematic view of the TFT shown in FIG. 4 with a third via.

Preferably, the array substrate can be an array substrate used in LCD, therefore, the array substrate further includes: a pixel electrode 11, the relationship between the pixel electrode 11 and the TFT is shown in FIGS. 4 and 5. That is, the pixel electrode 11 is connected to the drain 9 of the TFT, for example, through the semiconductor layer protection layer 13 and a via 12 in the second gate protection layer 6.

As described above, preferably, in the specific implementing process, the pixel electrode 11 is preferably disposed on the same layer as the gate isolation layer 5, and the pixel electrode 11 and the gate isolation layer 5 are made of the same material, which is a transparent metallic oxide conductive layer such as indium tin oxide ITO film layer. In the specific implementing process, the pixel electrode 11 and the gate isolation layer 5 are preferably made of the same material. As such, the pixel electrode 11 and the gate isolation lay 5 can be formed in a same patterning processing, that is to say, compared with the prior art, fabricating the gate isolation layer 5 at the same time when fabricating the pixel electrode 11 adds no processing flow.

Figure 7:
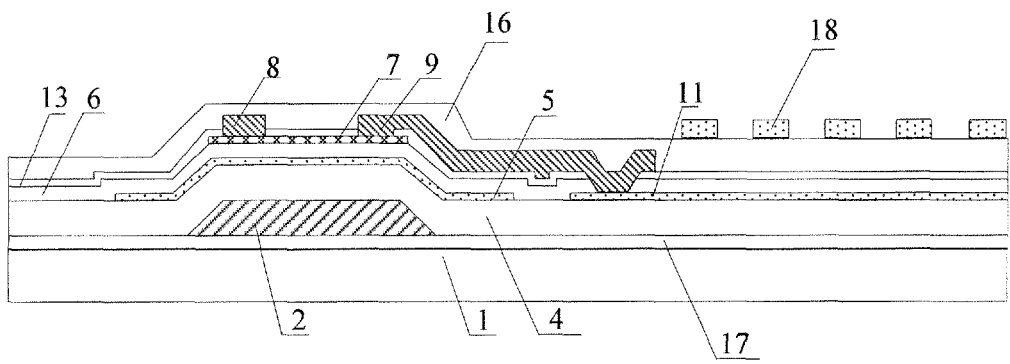
FIG. 7 is a structural schematic view of the array substrate shown in FIG. 6 with a common electrode and a buffer layer.

Preferably, the array substrate provided by an embodiment of the present invention further includes: a common electrode 18, referring to FIG. 7 which shows the position relationship between the common electrode 18 and the TFT, the common electrode 18 is located on a region of the passivation layer 16 corresponding to the pixel electrode 11.

The common electrode 18 may be plate shaped or slit shaped, and the so-called "slit shaped" is providing a plurality of slits at positions corresponding to the display areas of a pixel units, to improve transmittance of light ray and achieve a better image display effect. The slit shaped common electrode is preferably applicable to a display panel using advanced super dimension switch (ADS) techniques and the aperture ratio-advanced super dimension switch advanced super dimension switch (H-ADS) techniques, and the like. Specifically, in the ADS mode, a multi-dimension electric field is formed by the electric field generated at the edge of the slit electrodes in a same plane and the electric field generated between the slit electrode layer and the plate shape electrode layer, such that all oriented liquid crystal molecules between the slit electrodes in the liquid crystal cell and right above the electrodes can rotate, thereby improving operating efficiency of the liquid crystal and increasing transmission efficiency.

Of course, the common electrode provided by the embodiments of the present invention may but not limited to be appilied to an array substrate of ADS LCD or H-ADS LCD techniques; for example, it may also be an array substrate using in-plane switching (IPS) techniques.

Of course, there may be no common electrode in the array substrate of an embodiments of the present invention, that is, the common electrode may also be disposed on a substrate (such as a color film substrate) which assembles with the array substrate to form a cell.

Of course, the array substrate of an embodiment of the present invention is not limited to be used in LCD, that is, the array substrate may has no pixel electrode therein; for example, for an array substrate of an OLED, it has a cathode, an organic luminescent layer, an anode, and other structures.

For an top-gate type TFT, it has similar structure as the above bottom-gate type TFT, except that the positions where the gate 2 of and the semiconductor layer 7 of the top-gate type TFT are located are different. Referring to FIG. 8, the array substrate includes:

a substrate 1;

a source 8 and a drain 9 formed on the substrate 1;

a semiconductor layer 7 at least partly covering the source 8 and the drain 9;

a second gate protection layer 6 located on the semiconductor layer 7;

a gate isolation layer 5 located on the second gate protection layer 6;

a first gate protection layer 4 at least covering the gate isolation layer 5;

a gate 2 located on the first gate protection layer 4; wherein, the gate 2 is preferably made of copper.

The first gate protection layer 4 and the second gate protection layer 6 are insulating layers.

Preferably, the vertical projection of the gate isolation layer 5 on the substrate 1 exceeds the vertical projection of the semiconductor layer 7 on the substrate 1; the vertical projection of the source 8 and the drain 9 on the substrate 1 exceeds the vertical projection of the semiconductor layer 7 on the substrate 1; and the TFT further includes a semiconductor layer protection layer 13, the semiconductor layer protection layer 13 is an insulating layer, and at least partly located between the part of the gate isolation layer 5 exceeding the semiconductor layer 7 and the part of the source 8 and the drain 9 exceeding the semiconductor layer 7.

Preferably, the TFT further includes: a passivation layer 16 and a buffer layer 17; the passivation layer 16 is located on the gate 2 for protecting the TFT from external damages; the buffer layer 17 is located between the layer where the source 8 and the drain 9 are located and the substrate 1.

Preferably, referring to FIG. 8, the array substrate of the top-gate type TFT provided by the embodiment further includes: a pixel electrode 11, the pixel electrode 11 and the gate isolation layer 5 are located in the same layer, and preferably, the pixel electrode 11 is connected to the drain 9 through a via.

Other structures of the array substrate of a top-gate type TFT are similar to those of the array substrate of a bottom-gate type TFT, and thus will not be elaborated.

Obviously, the array substrates shown in the above mentioned respective Figures are just schematic, and are not used to define the quantity, the absolute location, and the relative size of its respective structures. For purpose of clarity, part of the structures are not shown in some Figures.

In the following, a method for manufacturing the array substrate provided by an embodiment of the present invention will be described from processing flow.

The manufacturing method of an array substrate provided by an embodiment of the present invention includes:

a process of forming a gate and a gate line, a source and a data line, a drain and a semiconductor layer, and a process of forming a first gate protection layer, a gate isolation layer, a second gate protection layer and a semiconductor layer protection layer;

Wherein, the first gate protection layer is at least partly located between the gate and the gate isolation layer, and is an insulating layer; the gate isolation layer is at least partly located between the first gate protection layer and said the second gate protection layer, and is a conductive layer; the second gate protection layer is at least partly located between the gate isolation layer and the semiconductor layer, and is an insulating layer.

Figure 9:
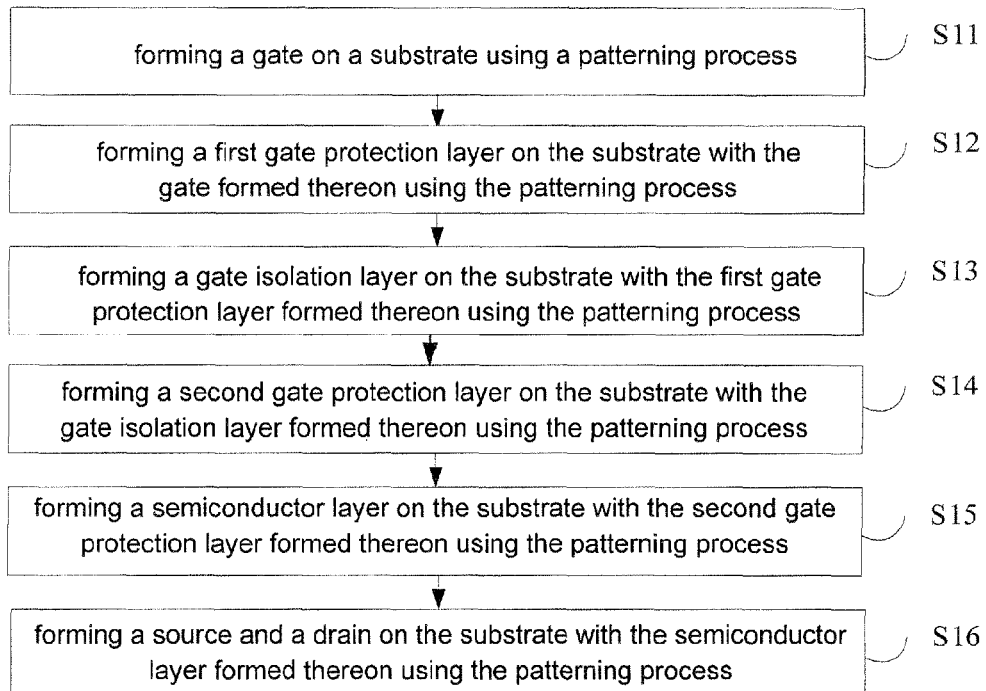
FIG. 9 is a schematic flow chart of a manufacturing method of the bottom-gate type TFT shown in an embodiment of the present invention.

Referring to FIG. 9, a method for manufacturing the array substrate of a bottom-gate type TFT includes:

S11. forming a gate on a substrate using a patterning process;

S12. forming a first gate protection layer on the substrate with the gate formed thereon using the patterning process;

S13. forming a gate isolation layer on the substrate with the first gate protection layer formed thereon using the patterning process;

S14. forming a second gate protection layer on the substrate with the gate isolation layer formed thereon using the patterning process;

S15. forming a semiconductor layer on the substrate with the second gate protection layer formed thereon using the patterning process;

S16. forming a source and a drain on the substrate with the semiconductor layer formed thereon using the patterning process.

Wherein, the patterning process in the embodiment of the present invention includes part or all processes of forming a material layer, coating photoresist, masking, exposure, developing, etching, photoresist stripping and the like.

For example, a gate is formed on a substrate using the patterning process, specifically, a gate layer is first deposited on the substrate, then a photoresist is coated, the photoresist is exposed and developed to form a photoresist pattern using a mask plate, the photoresist pattern is subsequently used as a etching mask, the exposed gate layer is removed through etching or other processes, the remaining photoresist is further removed, and finally a pattern including the gate is formed on the substrate.

Preferably, between the step S15 and the step S1, it further includes: forming a semiconductor layer protection layer on the semiconductor layer using the patterning process.

Preferably, before the step S11, it further includes: forming a buffer layer on the substrate.

Preferably, the step S13 further includes: forming a pixel electrode which is located on a same layer as the gate isolation layer at the same time when forming the gate isolation layer using the patterning process, the gate isolation layer and pixel electrode are manufactured using one-time patterning process.

Preferably, after the step S16, it further includes: forming a passivation layer at least covering the outmost source and gate of the thin film transistor.

Figure 10:
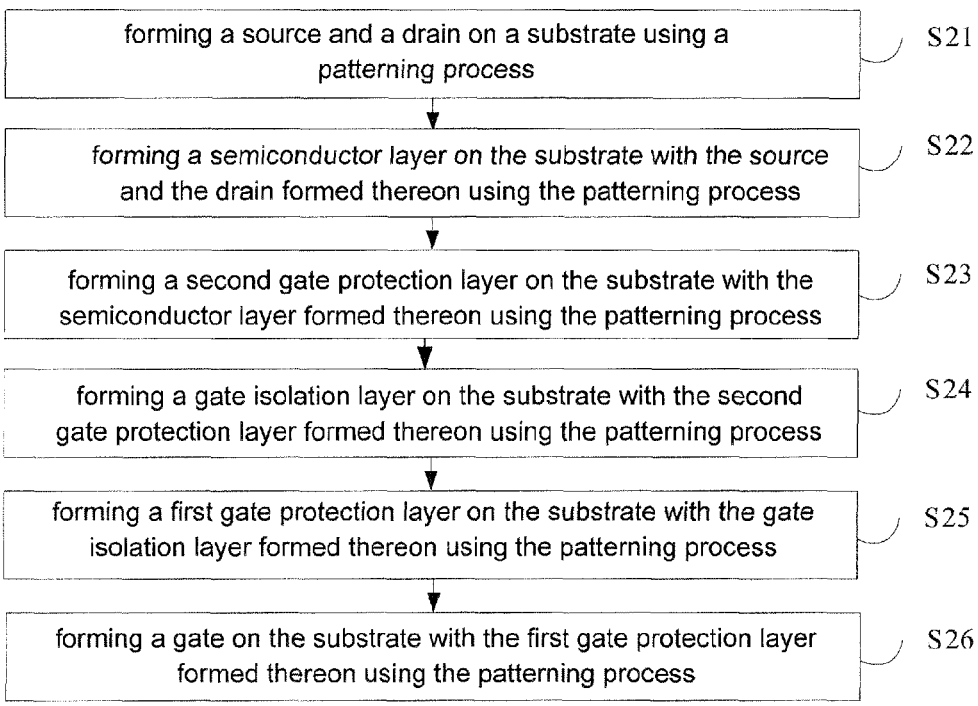
FIG. 10 is a schematic flow chart of a manufacturing method of the top-gate type TFT shown in another embodiment of the present invention.

Referring to FIG. 10, a method for manufacturing a top-gate type TFT includes:

S21. forming a source and a drain on a substrate using a patterning process;

S22. forming a semiconductor layer on the substrate with the source and the drain formed thereon using the patterning process;

S23. forming a second gate protection layer on the substrate with the semiconductor layer formed thereon using the patterning process;

S24. forming a gate isolation layer on the substrate with the second gate protection layer formed thereon using the patterning process;

S25, forming a first gate protection layer on the substrate with the gate isolation layer formed thereon using the patterning process;

S26. forming a gate on the substrate with the first gate protection layer formed thereon using the patterning process.

Preferably, between the step S21 and the step S22, it further includes: forming a semiconductor layer protection layer on the substrate with the source and the drain formed thereon using the patterning process.

Preferably, before the step S21, it further includes: forming a buffer layer on the substrate.

Preferably, the step S24 further includes: forming a pixel electrode which is located on a same layer as the gate isolation layer at same time when forming the gate isolation layer using the patterning process, the gate isolation layer and pixel electrode are manufactured using one-time patterning process.

Preferably, after the step S25, it further includes: forming a passivation layer on the outmost gate of the thin film transistor.

Taking the fabrication of the array substrate of the bottom-gate type metal oxide TFT shown in FIG. 7 as an example, the specific processing flow will be described below:

A manufacturing method of an array substrate according to an embodiment of the present invention includes:

Step one: the forming processing of a buffer layer, a gate and a gate line on a substrate.

Firstly, in order to increase the adhesion between the respective film layers of the TFT and the glass substrate, the buffer layer covering the whole substrate is formed on a transparent glass substrate or a quartz substrate using sputtering or thermal evaporation, the buffer layer may be formed of a metal such as molybdenum (Mo), titanium (Ti), Mo alloy, Ti alloy, Cu alloy, and the like, and its thickness is about 50~800 Å.

Afterwards, a copper metal layer with thickness of 2000 Å~10000 Å is deposited on the substrate with the buffer layer formed thereon by using the method of sputtering or thermal evaporation, and the gate and the gate line are formed using a patterning process. The patterns and positions of the formed gate and gate line are the same as those in the prior art, and will not be elaborated here.

Step two: the forming processing of a first gate protection layer on the substrate.

An insulating layer with thickness of 500 Å~5000 Å is continuously deposited on the substrate subjected to the step one through plasma enhanced chemical vapour deposition process (PECVD), the insulating layer is an insulating layer of a to-be-formed first gate protection layer; specifically, the first gate protection layer may be a silicon oxide or a silicon nitride layer. The silicon oxide or silicon nitride layer may be formed by oxide, nitride or oxynitride, and reactant gas through chemical vapour deposition. The reactant gas may be a mixture of silane ($SiH_4$), ammonia ($NH_3$), nitrogen ($N_2$) or a mixture of silicon dichloride ($SiH_2Cl_2$), ammonia ($NH_3$) and nitrogen ($N_2$). For example: the power of depositing the first gate protection layer can be control to be 2300 W~2500 W, the gas flow rate of $SiH_4$ is 2200 sccm~2600 sccm, and the gas flow rates of ammonia ($NH_3$) and nitrogen ($N_2$) are 12000 sccm~15000 sccm, respectively; the depositing pressure is 2500 mtorr~2700 mtorr.

Step three: the forming processing of a gate isolation layer and a pixel electrode on the substrate.

A transparent conductive layer with thickness of 50~2000 Å is continuously deposited on the substrate with the first gate protection layer formed thereon through sputterring, and a gate isolation layer and a pixel electrode are formed through a one-time patterning process.

The transparent conductive layer may be indium Tin oxide ITO or indium zinc oxide IZO, or may be other transparent metal oxides.

In this step, a pixel electrode and a gate isolation layer are formed through the one-time patterning process, compared with the prior art, the isolation function of Cu ions is achieved without adding any process flow, the gate isolation layer has a better blocking function against the Cu ions than the gate protection layer, and this structure can effectively prevent the Cu ions from diffusing, especially the diffusion of the Cu ions in a high-temperature process, and thus improving the performance and the TFT.

Step four: the forming processing of a second gate protection layer.

Similar to the processing of forming the first gate protection layer, a second gate protection layer is formed by continuously depositing on the substrate subjected to the step three through PECVD Preferably, in order to improve the performance of the TFT, the deposition rate of the second gate protection layer is lower, the thin film is with good quality, and a good interface can be formed with the semiconductor layer. The thickness of the second gate protection layer is less than that of the first gate protection layer, and is about 50~3000 Å.

Specifically, the implementation of the second gate protection layer may be as follows:

A second gate protection layer with thickness of 50~3000 Å is continuously deposited through PECVD, and the deposition power is 550 W~750 W; the gas flow rate of SiH4 is 1400 sccm~1600 sccm; the gas flow rates of ammonia $NH_3$ and nitrogen $N_2$ are 7000 sccm~8500 sccm, respectively; and the deposition pressure is 2500 mtorr~2700 mtorr. The deposition rate of the second gate protection layer is less than that of the first gate protection layer. The second gate protection layer has a thickness of 50~3000 Å, which is equivalent to or less than the thickness of the first gate protection layer.

The above parameters for implementing the first gate protection layer and the second gate protection layer are only intended to illustrate that the deposition rate of the second gate protection layer is lower than that of the first gate protection layer, and in the specific implementation, it is not limited to use the above deposition power, deposition pressure, or other parameters.

Step five: the forming processing of a semiconductor layer on the substrate.

A metal oxide semiconductor film layer with thickness of 50~1000 Å is continuously deposited through sputtering, and a semiconductor layer is formed through a patterning process.

The metal oxide may be indium gallium zinc oxide IGZO, hafnium indium zinc oxide HIZO, amorphous indium zinc oxide a-InZnO, amorphous zinc oxide doped oxyfluoride ZnO:F, indium oxide doped tin oxide $In_2O_3$:Sn, amorphous indium oxide doped molybdenum oxide $In_2O_3$:Mo, chromium tin oxide $Cd_2SnO_4$, amorphous zinc oxide doped alumina oxide ZnO:Al, amorphous titanium oxide doped niobium oxide $TiO_2$:Nb, chromium tin oxide Cd—Sn—O or other metal oxides.

Of course, using other materials, such as amorphous silicon semiconductor, as the semiconductor layer will also work.

Step six: the forming processing of a semiconductor layer protection layer on the substrate.

On the substrate subjected to the step five, a metal oxide film layer with thickness of 500~3000 Å is deposited through chemical vapour deposition PECVD, and a semiconductor layer protection layer covering the semiconductor layer is formed through the patterning process.

The semiconductor layer protection layer may be formed of silicon oxide or silicon nitride. The silicon oxide or silicon nitride may be formed by oxide, nitride or oxynitride, and reactant gas. The reactant gas corresponding to silicon oxide is $SiH_4$, $N_2O$, the reactant gas corresponding to nitride or oxynitride is a mixture of $SiH_4$, $NH_3$, $N_2$ or a mixture of $SiH_2Cl_2$, $NH_3$, $N_2$.

The semiconductor layer protection layer may also use alumina $Al_2O_3$, or may be a multi-layer blocking structure being formed of silicon oxide or silicon nitride or alumina $Al_2O_3$.

Step seven: the forming processing of a first via, a second via, a third via on the substrate.

On the substrate with the semiconductor layer protection layer formed thereon, a second via connecting the source and the semiconductor layer, a third via connecting the drain and the semiconductor layer and a first via connecting the gate isolation layer and the drain are formed through a patterning process.

Step eight: the forming processing of a source, a drain, and a data line on the substrate.

A metal film layer with thickness of 2000~4000 Å is formed on the substrate with the first via, the second via and the third via formed thereon through sputtering or thermal evaporation method, and a source, a drain and a data line connected to the source are formed through a patterning process.

The metal film layer may be chrome (Cr), wolfram (W), titanium (Ti), tantalum (Ta), molybdenum (Mo) or other metals, or an alloy of at least two of the foregoing metals. It may be a single-layer metal layer or a multi-layer metal layer.

After forming the source, the drain, and the data line, the source is connected to the semiconductor layer through the second via, the drain is connected to the semiconductor layer through the third via, and the drain is connected to the pixel electrode through the first via.

Step nine: the forming processing of a passivation layer on the substrate.

On the substrate subjected to step eight, a passivation layer with thickness of 2000 is deposited through PECVD, the passivation layer may use oxide, nitride or oxynitride, and the reactant gas corresponding to silicon oxide may be $SiH_4$, $N_2O$; the reactant gas corresponding to nitride or oxynitride is a mixture of $SiH_4$, $NH_3$, $N_2$ or a mixture of $SiH_2Cl_2$, $NH_3$, $N_2$; and the passivation layer may use $Al_2O_3$ film layer, or a double-layer or multi-layer blocking structure.

In addition, in this processing, a gate weld region Gate PAD and a source and drain weld region SD PAD may also be formed through a patterning process, to facilitate connecting the circuit board to the gate line and the data line subsequently.

Specifically, the forming processing of a passivation layer is: a layer of organic resin with thickness of about 4000~30000 Å is coated on the substrate with the source, the drain, and the data line formed thereon, the organic resin may be Benzocyclobutene (BCB) or other organic photosensitive materials.

A layer of photosensitive organic resin with a thickness of about 4000~30000 Å is coated, and a Gate PAD and a SD PAD in the peripheral region on the array substrate are formed through a patterning process.

Step ten: the forming processing of a common electrode on the substrate.

On the substrate subjected to the step nine, a transparent conductive film layer with thickness of about 300~1500 Å is formed through sputtering or thermal evaporation.

The common electrode is formed after a patterning process. The common electrode may be ITO, IZO, or other transparent metal oxides.

The process flow of forming an array substrate of a top-gate type metal oxide TFT is similar to the above step one to step ten which forms the process flow of forming an array substrate of a bottom-gate type metal oxide TFT, except that the semiconductor layer is formed firstly and the gate is then formed, and the forming order of the corresponding source/drain, the semiconductor layer protection layer, the second gate protection layer, the first gate protection layer, and the gate isolation layer is also different from that when forming the bottom-type TFT, and will not be elaborated here.

Embodiments of the present invention also provide a display device, including the above array substrate, the display device may be a liquid crystal panel, a liquid crystal display, a liquid crystal television, an OLED panel, an OLED display, an OLED television, an electronic paper or other display devices.

One example of the display device is the liquid crystal display device, wherein, an array substrate and an opposed-substrate are disposed opposite to each other to form a liquid crystal cell, and the liquid crystal cell is filled with liquid crystal material therein. The opposed-substrate is for example a color film substrate. The pixel electrode of each pixel unit of the array substrate is used to apply electric field to control the rotation degree of the liquid crystal material, thereby performing display operation. In some examples, the liquid crystal display further includes a backlight source which provides backlight for the array substrate.

Another example of the display device is an organic electroluminescence (OLED) display device, wherein, the thin film transistor of each pixel unit of the array substrate is connected to the anode or the cathode of the organic electroluminescence, such that the organic luminescent material is driven to emit light to perform display operation (in this case, there is no pixel electrode included in its array substrate).

In summary, embodiments of the present invention provide a thin film transistor and its manufacturing method, an array substrate and a display device, wherein a conductive gate isolation layer is used to prevent the gate copper ions from entering into a semiconductor layer, and therefore, the operation performance of the TFT can be guaranteed and the picture quality of images can be improved.

Obviously, various modifications and variations can be made to the embodiments of the present invention by the person skilled in the art without departing from the spirit and scope of the present invention. As such, if these modifications and variations fall within the scope of the claims of the present invention and its equivalent, the present invention is intended to include these modifications and variations.

The invention claimed is:

1. A thin film transistor, comprising:
a substrate;
a gate, a source, a drain and a semiconductor layer formed on the substrate;
a first gate protection layer;
a gate isolation layer; and
a second gate protection layer,
wherein the first gate protection layer is at least partly located directly between the gate and the gate isolation layer, and is an insulating layer,
the gate isolation layer is at least partly located directly between the first gate protection layer and the second gate protection layer, and is a conductive layer, and
the second gate protection layer is at least partly located directly between the gate isolation layer and the semiconductor layer, and is an insulating layer.

2. The thin film transistor according to claim 1, wherein, the gate isolation layer is made of a transparent metallic oxide material, or
the gate isolation layer is made of any one or any alloy of molybdenum, aluminum and niobium.

3. The thin film transistor according to claim 1, wherein, a vertical projection of the gate isolation layer on the substrate overlaps with a vertical projection of the gate on the substrate.

4. The thin film transistor according to claim 1, wherein, thickness of the second gate protection layer is less than that of the first gate protection layer.

5. The thin film transistor according to claim 1, wherein, the gate is located on the substrate;
the first gate protection layer at least cover the gate;
the gate isolation layer is located on the first gate protection layer;
the second gate protection layer at least cover the gate isolation layer;
the semiconductor layer is located on the second gate protection layer; and
the source and the drain are located at least partly on the semiconductor layer.

6. The thin film transistor according to the claim 5, further comprising:
a passivation layer, the passivation layer at least cover the source and the drain.

7. The thin film transistor according to claim 1, wherein, the source and the drain are located on the substrate;
the semiconductor layer at least partly covers the source and drain;
the second gate protection layer at least covers the semiconductor layer;
the gate isolation layer is located on the second gate protection layer;
the first gate protection layer at least covers the gate isolation layer; and
the gate is located on the first gate protection layer.

8. The thin film transistor according to claim 7, further comprising:
a passivation layer, the passivation layer at least covers the gate.

9. The thin film transistor according to claim 1, wherein,
a vertical projection of the gate isolation layer on the substrate exceeds a vertical projection of the semiconductor layer on the substrate;
a vertical projection of the source and the drain on the substrate exceeds the vertical projection of the semiconductor layer on the substrate;
the thin film transistor further comprises: a semiconductor layer protection layer, the semiconductor layer protection layer is an insulating layer and is at least partly located between a part of the gate isolation layer exceeding the semiconductor layer and a part of the source and the drain exceeding the semiconductor layer.

10. The thin film transistor according to claim 9, wherein, the semiconductor layer protection layer at least partly contacts with the semiconductor layer, and the source and the drain are connected to the semiconductor layer through vias in the semiconductor layer protection layer.

11. The thin film transistor according to claim 1, further comprising:
a buffer layer, the buffer layer is positioned on a side where respective film layers of the thin film transistor are to be formed, of the substrate.

12. The thin film transistor according to claim 1, wherein, the gate is made of copper.

13. An array substrate, comprising:
the thin film transistor according to claim 1;
a pixel electrode, the pixel electrode and the gate isolation layer are disposed on the same layer; and
a gate line connected to the gate, and a vertical projection of the gate and gate line on the substrate does not exceed a vertical projection of the gate isolation layer on the substrate.

14. A display device, comprising the array substrate according to claim 13.

15. A manufacturing method of a thin film transistor, comprising:
a process of forming a gate, a source, a drain and a semiconductor layer; and
a process of forming a first gate protection layer, a gate isolation layer, and a second gate protection layer;
wherein, the first gate protection layer is at least partly located directly between the gate and the gate isolation layer, and is an insulating layer,
the gate isolation layer is at least partly located directly between the first gate protection layer and the second gate protection layer, and is a conductive layer, and
the second gate protection layer is at least partly located directly between the gate isolation layer and the semiconductor layer, and is an insulating layer.

16. The manufacturing method of the thin film transistor according to claim 15 wherein, the process of forming the gate, the source, the drain and the semiconductor layer and the process of forming the first gate protection layer, the gate isolation layer, and the second gate protection layer specifically comprise:
  forming the gate on a substrate using a patterning process;
  forming the first gate protection layer on the substrate with the gate formed thereon using the patterning process;
  forming the gate isolation layer on the substrate with the first gate protection layer formed thereon using the patterning process;
  forming the second gate protection layer on the substrate with the gate isolation layer formed thereon using the patterning process;
  forming the semiconductor layer on the substrate with the second gate protection layer formed thereon using the patterning process;
  forming the source and the drain on the substrate with the semiconductor layer formed thereon using the patterning process; and
  forming a passivation layer on the substrate with the source and the drain formed thereon,
  wherein, after forming the semiconductor layer and before forming the source and the drain, the manufacturing method further comprising:
  forming a semiconductor layer protection layer on the substrate with the semiconductor layer formed thereon using the patterning process, the source and the drain are formed on the semiconductor layer protection layer, and are connected to the semiconductor layer through vias in the semiconductor layer protection layer.

17. The manufacturing method of the thin film transistor according to the claim 15, wherein, the process of forming the gate, the source, the drain and the semiconductor layer and the process of forming the first gate protection layer, the gate isolation layer and the second gate protection layer specifically comprise:
  forming the source and the drain on a substrate using a patterning process;
  forming a semiconductor layer on the substrate with the source and the drain formed thereon using the patterning process;
  forming the second gate protection layer on the substrate with the semiconductor layer formed thereon using the patterning process;
  forming the gate isolation layer on the substrate with the second gate protection layer formed thereon using the patterning process;
  forming the first gate protection layer on the substrate with the gate isolation layer formed thereon using the patterning process;
  forming the gate on the substrate with the first gate protection layer formed thereon using the patterning process; and
  forming a passivation layer on the substrate with the gate formed thereon,
  wherein, after forming the source and the drain and before forming the semiconductor layer, the manufacturing method further comprising:
  forming a semiconductor layer protection layer on the substrate with the source and the drain formed thereon, the semiconductor layer is formed on the semiconductor layer protection layer, and the source and the drain are connected to the semiconductor layer through vias in the semiconductor layer protection layer.

18. The manufacturing method of the thin film transistor according to claim 15, wherein, before the process of forming the gate, the source, the drain and the semiconductor layer and the process of forming the first gate protection layer, the gate isolation layer and the second gate protection layer, furthering comprising:
  forming a buffer layer on the substrate.

19. The manufacturing method of the thin film transistor according to claim 15, wherein,
  the thin film transistor is located in an array substrate, the array substrate further comprises a pixel electrode;
  forming the pixel electrode which is located on a same layer as the gate isolation layer at the same time when forming the gate isolation layer using the patterning process, the gate isolation layer and the pixel electrode are manufactured by using one-time patterning process.

* * * * *